(12) United States Patent
Choi (10) Patent No.: US 7,701,273 B2
(45) Date of Patent: Apr. 20, 2010

(54) DELAY LOCKED LOOP CIRCUIT WITH DUTY CYCLE CORRECTION AND METHOD OF CONTROLLING THE SAME

(75) Inventor: Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 106 days.

(21) Appl. No.: 11/878,244

(22) Filed: Jul. 23, 2007

(65) Prior Publication Data

US 2008/0191757 A1 Aug. 14, 2008

(30) Foreign Application Priority Data

Feb. 9, 2007 (KR) .................. 10-2007-0014061

(51) Int. Cl.
*H03L 7/06* (2006.01)
(52) U.S. Cl. .................................. 327/158; 327/175
(58) Field of Classification Search ............. 327/147, 327/150, 152, 156, 159, 161, 153, 149, 172–175; 331/1 R, 18, 25, 34; 375/373–376
See application file for complete search history.

(56) References Cited

U.S. PATENT DOCUMENTS

| 6,853,225 | B2 | 2/2005 | Lee |
| 6,859,081 | B2 | 2/2005 | Hong et al. |
| 6,963,235 | B2 | 11/2005 | Lee |
| 7,135,906 | B2 * | 11/2006 | Takai et al. .................. 327/263 |
| 7,282,974 | B2 * | 10/2007 | Lee ............................. 327/158 |
| 7,365,583 | B2 * | 4/2008 | Shin ........................... 327/158 |
| 7,449,930 | B2 * | 11/2008 | Hur ............................ 327/158 |
| 2003/0108139 | A1 * | 6/2003 | Jung ........................... 375/376 |
| 2003/0117194 | A1 * | 6/2003 | Lee ............................. 327/158 |
| 2003/0184355 | A1 * | 10/2003 | Lee ............................. 327/158 |
| 2004/0066873 | A1 | 4/2004 | Cho et al. |
| 2004/0155686 | A1 * | 8/2004 | Kim et al. .................... 327/158 |
| 2004/0217788 | A1 * | 11/2004 | Kim ............................ 327/158 |
| 2006/0197565 | A1 | 9/2006 | Kang |
| 2007/0262798 | A1 * | 11/2007 | Yun et al. .................... 327/158 |

FOREIGN PATENT DOCUMENTS

| JP | 2004129255 | 4/2004 |
| KR | 1020030090129 | 11/2003 |
| KR | 1020040081529 | 9/2004 |
| KR | 1020040090180 | 10/2004 |
| KR | 1020050097700 | 10/2005 |

* cited by examiner

*Primary Examiner*—Long Nguyen
*Assistant Examiner*—Sibin Chen
(74) *Attorney, Agent, or Firm*—Venable LLP; Jeffri A. Kaminski (57) ABSTRACT

A delay locked loop block receives external clocks to generate first internal clocks including a reference clock. An internal delay unit delays the first internal clocks to output second internal clocks, which are fed back to the delay locked loop block. The delay locked loop block adjusts delay time of the delay unit according to a phase difference between each second internal clock and the reference clock so that the second internal clocks are delay locked. A duty cycle correcting block corrects a duty cycle of each second internal clock and outputs a duty cycle corrected clock. An error determining unit compares a phase of each second internal clock with one another and, based on the comparison, feeds back a feedback clock including one of the duty cycle corrected clock or the second internal clock to the delay locked loop block.

13 Claims, 6 Drawing Sheets

FIG. 1A

EARLY STAGE IN WHICH DUTY CORRECTION
ERROR OCCURS

FIG. 1B

FAILURE OCCURS DUE TO ACCUMULATION OF ERROR
IN RCLK DUTY CORRECTION

Abnormal 1

FIG. 6D

Abnormal 2

DELAY LOCKED LOOP CIRCUIT WITH DUTY CYCLE CORRECTION AND METHOD OF CONTROLLING THE SAME

CROSS-REFERENCE TO RELATED PATENT APPLICATION

This application claims priority to the Korean Patent Application No. 10-2007-0014061, filed on Feb. 9, 2007, in the Korean Intellectual Property Office, the disclosure of which is incorporated herein in its entirety by reference.

BACKGROUND

The present invention relates to a delayed locked loop, and more particularly, to a delayed locked loop circuit with duty cycle correction and a method of controlling the same.

In general, clocks that are used in systems or circuits are used as references to match operating timings. The clocks may also be used to ensure a high-speed operation without the occurrence of any error. When a clock that is input from the outside of a semiconductor circuit is used in the semiconductor circuit, clock skew, that is, a time delay occurs due to an internal circuit. A delay locked loop circuit is used to correct the time delay, such that an internal clock and the external clock have the same phases as each other.

Further, when the semiconductor circuit operates, the clocks need to be delay locked. However, it is also important to maintain a duty ratio of a rising period and a falling period of each of the clocks to 50:50. Therefore, general delay locked loop circuits to which duty cycle correction circuits are added are being currently used in semiconductor circuit technology.

Meanwhile, the delay locked loop circuit with duty cycle correction according to the related art may cause a duty correction error according to a change in process, voltage, and temperature (hereinafter, simply referred to as "PVT").

That is, after a rising clock RCLK in synchronization with a rising edge of the external clock and a falling clock FCLK in synchronization with a falling edge of the external clock are delay locked, a phase delay may occur due to the change in PVT.

Figure 1A:
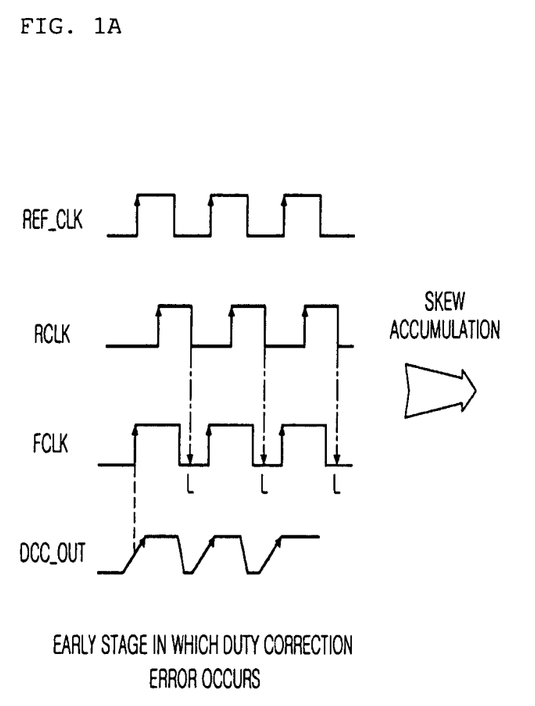
FIGS. 1A and 1B show waveform diagrams illustrating a state in which a duty correction error occurs according to the related art.
Figure 1B:
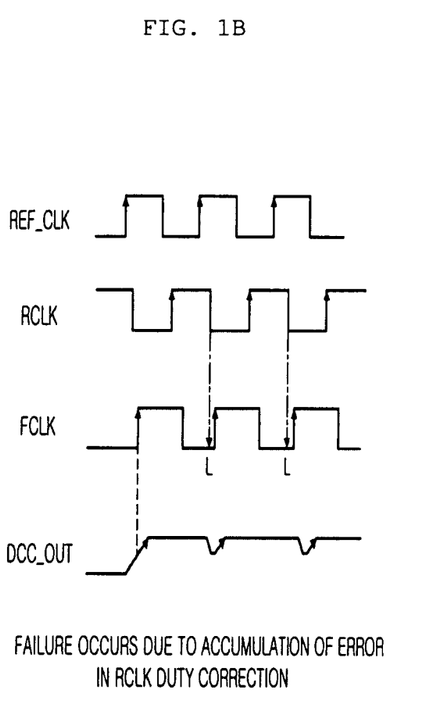

The duty correction is performed by comparing a phase of the rising clock RCLK with a phase of the falling clock FCLK and adjusting the width of a rising period or a falling period of each of the two clocks. When the amount of phase delay of the rising clock RCLK is different from that of the falling clock FCLK, the phase of the rising clock RCLK is not corrected. FIG. 1 is a diagram illustrating an early stage in which a duty correction error occurs. As in a duty cycle corrected clock DCC_OUT as shown in FIG. 1A, an error occurs when the duty ratio of the rising period and the falling period is not 50:50.

The duty cycle corrected clock DCC_OUT is fed back to the delay locked loop circuit and subjected to delay locked signal processing. Then, in the duty cycle correction circuit, the processed duty cycle corrected clock DCC_OUT is subjected to the duty cycle correction. These operations are repeatedly performed.

Since the delay locked signal processing operation and the duty cycle correction are repeated, the skew occurring when the duty correction error occurs, that is, a phase distortion component is accumulated. As a result, as in FIG. 1B, an abnormal signal in which a high-level period and a low-level period are not normally repeated is output.

As described above, the delay locked loop circuit with duty cycle correction according to the related art causes a duty cycle correction error due to a phase delay occurring according to a change in PVT. This causes a failure in the operation of the semiconductor circuit that uses the delay locked loop circuit.

SUMMARY

Embodiments of the present invention may provide a delay locked loop circuit with duty cycle correction that allows an accurate delay locking operation and duty cycle correction regardless of a change in PVT.

According to an embodiment of the invention, a delay locked loop circuit, may include: a delay locked loop block that may receive external clocks to generate first internal clocks including a reference clock, including an internal delay unit that may delay the first internal clocks to output second internal clocks, which are fed back to the delay locked loop block, which adjusts delay time of the delay unit according to a phase difference between each second internal clock and the reference clock so that the second internal clocks are delay locked; a duty cycle correcting block that may correct a duty cycle of each second internal clock and outputs a duty cycle corrected clock; and an error determining unit that may compare a phase of each second internal clock with one another and, based on the comparison, feeds back a feedback clock including one of the duty cycle corrected clock or the second internal clock to the delay locked loop block.

According to another embodiment of the invention, a method of controlling a delay locked loop circuit with duty cycle correction that may include a delay locked loop block and a duty cycle correcting block that corrects duty cycles of a plurality of clocks output from the delay locked loop block and outputs a duty cycle corrected clock, the method includes: determining whether or not an error occurs in the duty cycle corrected clock by using the plurality of clocks output from the delay locked loop block; and feeding back the duty cycle corrected clock or one of the plurality of clocks that are output by the delay locked loop block according to a result of determining whether or not the error occurs in the duty cycle corrected clock.

DETAILED DESCRIPTION

An exemplary embodiment of the present invention will now be described in detail with reference to the accompanying drawings.

Figure 2:
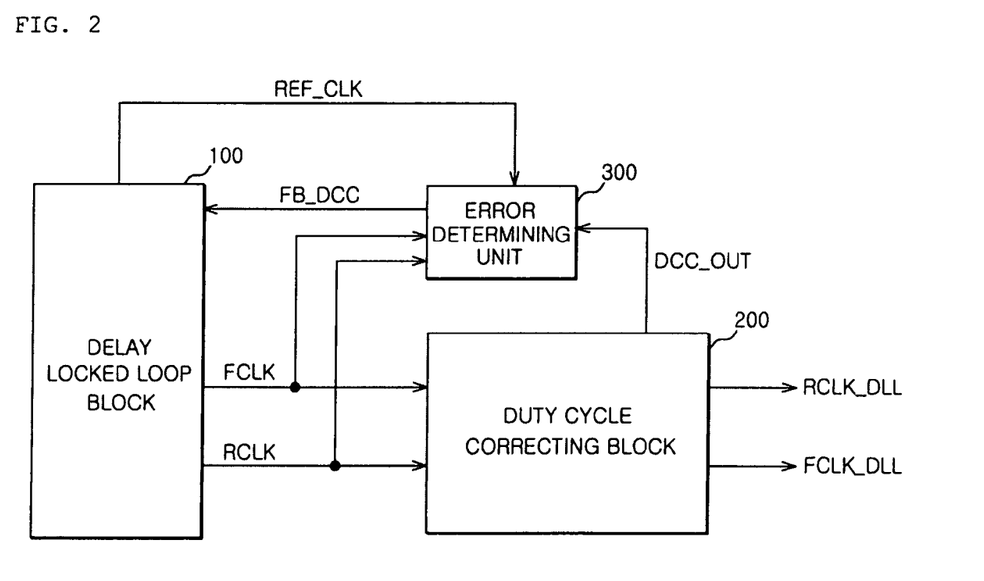
FIG. 2 is a block diagram illustrating a delay locked loop circuit with duty cycle correction according to an exemplary embodiment of the present invention.
Figure 3:
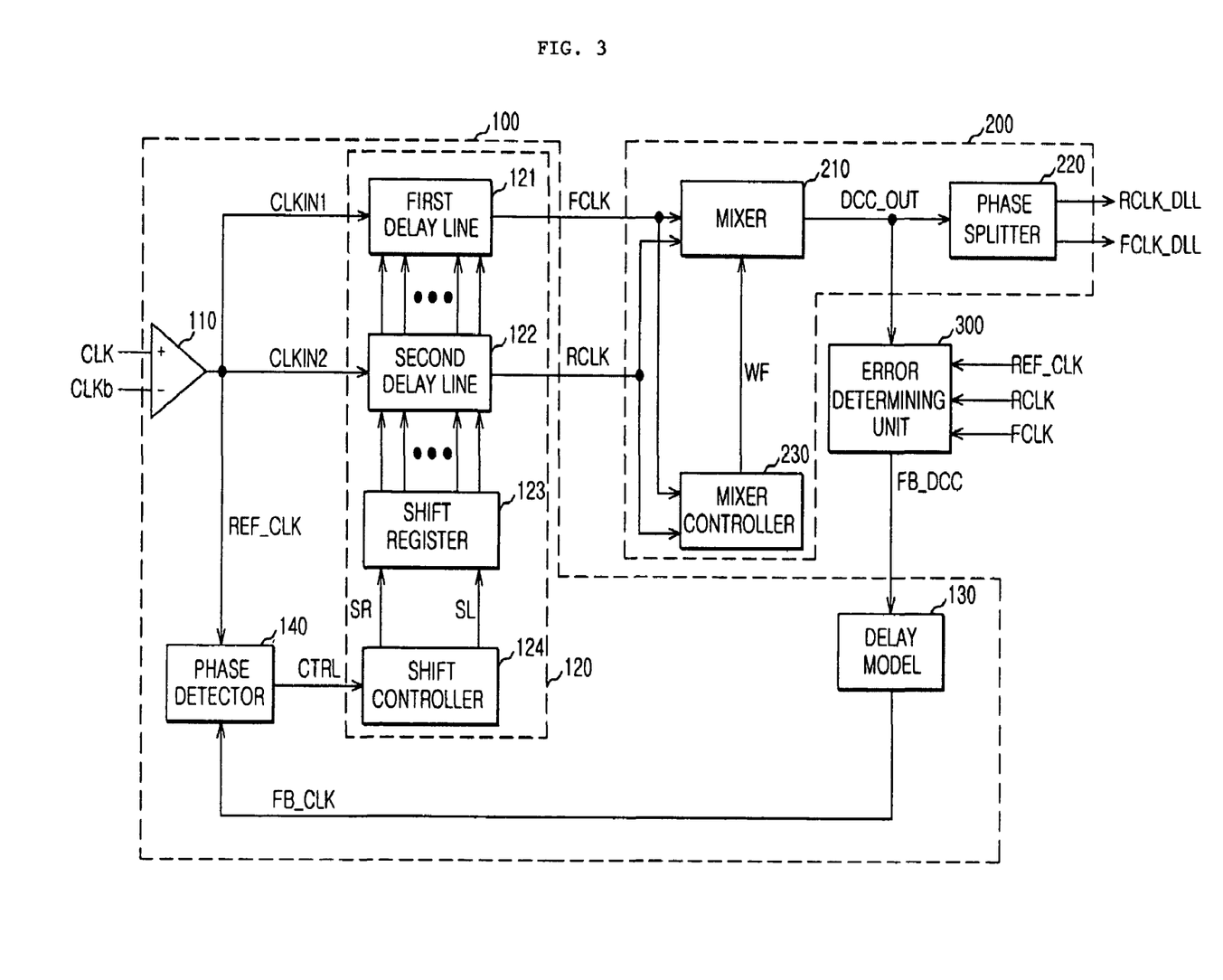
FIG. 3 is a block diagram illustrating the internal structure shown in FIG. 2.

Referring to FIGS. 2 and 3, a delay locked loop circuit with duty cycle correction may include a delay locked loop block 100, a duty cycle correcting block 200, and an error determining unit 300. The delay locked loop block 100 may receive external clocks CLK and CLKb and generates first internal clocks CLKIN1, CLKIN2, and REF_CLK. The delay locked loop block 100 may delay the first internal clocks CLKIN1, CLKIN2, and REF_CLK by using an internal delay unit so as to output a plurality of second internal clocks (hereinafter, referred to as "a falling clock FCLK and a rising clock RCLK"). The output falling clock FCLK and rising clock RCLK pass through the duty cycle correcting block 200 and the error determining unit 300, and are fed back to the delay locked loop block 100 as a signal FB_DCC. The delay locked loop block 100 may adjust delay time of the delay unit according to a phase difference between the clocks fed back to the delay locked loop block 100 and the first internal clocks CLKIN1, CLKIN2, and REF_CLK, such that the falling clock FCLK and the rising clock RCLK are delay locked. The duty cycle correcting block 200 may correct a duty cycle of each of the falling clock FCLK and the rising clock RCLK and then outputs a duty cycle corrected clock DCC_OUT. The error determining unit 300 determines whether a duty correction error occurs or not according to the result of the comparison between the phases of the falling clock FCLK and the rising clock RCLK. The error determining unit 300 may feed back the duty cycle corrected clock DCC_OUT or one of the falling clock FCLK and the rising clock RCLK to the delay locked loop block 100. The terms, the first internal clocks CLKIN1, CLKIN2, and REF_CLK, are used to differentiate signal paths. In one embodiment, the first internal clocks CLKIN1, CLKIN2, and REF_CLK may branch off from the same source.

As shown in FIG. 3, the exemplary delay locked loop block 100 may include a buffer 110 that receives the external clocks CLK and CLKb and generates the first internal clocks CLKIN1, CLKIN2, and REF_CLK, a register-controlled delay unit 120 that may delay the first internal clocks CLKIN1 and CLKIN2 by the delay amount that is increased or decreased according to a phase detection signal CTRL, and outputs them as the falling clock FCLK and the rising clock RCLK, respectively, a delay model 130 that delays a clock FB_DCC output from the error determining unit 300 by a predetermined amount of time, and a phase detector 140 that compares phases between the first internal clock REF_CLK (hereinafter, referred to as a "reference clock") and a clock FB_CLK output from the delay model 130 so as to output the phase detection signal CTRL.

The register-controlled delay unit 120 may include a first delay line 121 that delays the first internal clock CLKIN1 by a time corresponding to a register value and inverts the delayed clock so as to output the falling clock FCLK, a second delay line 122 that delays the first internal clock CLKIN2 by the time corresponding to the register value so as to output the rising clock RCLK, a shift register 123 that outputs the register value that is used to determine the delay amount of the first and second delay lines 121 and 122 according to shift control signals (Shift Right: SR and Shift Left: SL), and a shift controller 124 that outputs the shift control signals SR and SL to the shift register 123 according to the phase detection signal CTRL.

The delay model 130 may include a dummy clock buffer, a dummy output buffer, a dummy load, and the like. The delay model 130 is also called a replica circuit.

The duty cycle correcting block 200 may include a mixer 210 that corrects the duty cycle of each of the falling clock FCLK and the rising clock RCLK according to a control signal WF so as to output the duty cycle corrected clock DCC_OUT, a phase splitter 220 that splits a phase of the duty cycle corrected clock DCC_OUT and outputs delay locked loop clocks RCLK_DLL and FCLK_DLL, and a mixer controller 230 that compares the phases between the falling clock FCLK and the rising clock RCLK so as to generate the control signal WF according to the comparison result. The phase splitter 220 includes a phase splitter circuit that splits the phase of the duty cycle corrected clock DCC_OUT and a driver that drives two signals obtained by splitting the phase of the duty cycle corrected clock DCC_OUT so as to generate the delay locked loop clocks RCLK_DLL and FCLK_DLL.

Figure 4:
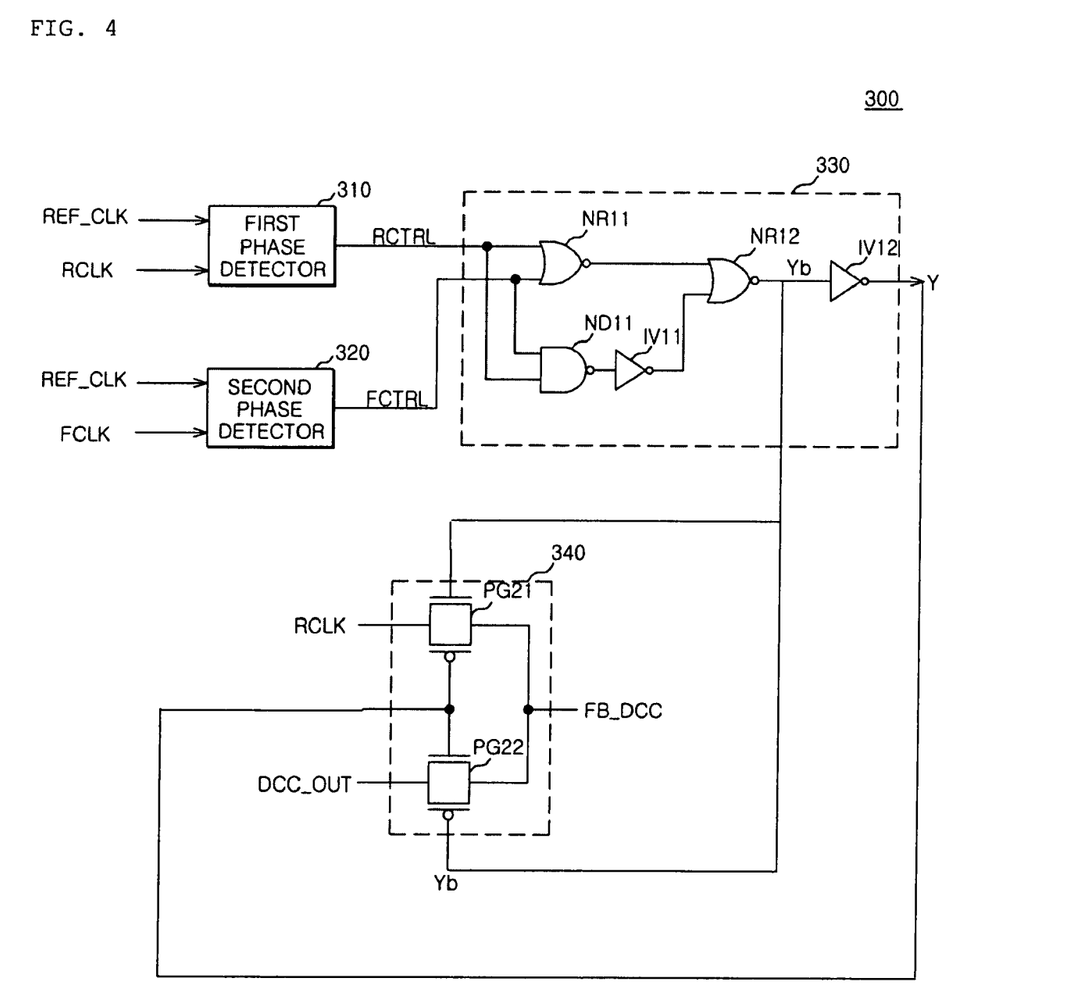
FIG. 4 is a circuit diagram illustrating an exemplary error determining unit of FIG. 3.

As shown in FIG. 4, the error determining unit 300 may include a first phase detector 310 that detects the phase of the rising clock RCLK by using the reference clock REF_CLK and outputs a first phase detection signal RCTRL, a second phase detector 320 that detects the phase of the falling clock FCLK by using the reference clock REF_CLK and outputs a second phase detection signal FCTRL, a selection signal generator 330 that combines the first and second phase detection signals RCTRL and FCTRL so as to generate selection signals Y and Yb, and a signal selector 340 that outputs the rising clock RCLK or the duty cycle corrected clock DCC_OUT according to the selection signals Y and Yb. When a duty correction error occurs, the signal selector 340 outputs the rising clock RCLK. When the duty correction error occurs, the duty cycle corrected clock DCC_OUT is not in a normal state. Therefore, the rising clock RCLK that is in a state before being subjected to the duty cycle correction is fed back to the delay locked loop block 100. In this embodiment, the rising clock RCLK is selected as one of the rising clock RCLK or the falling clock FCLK that is not subjected to duty cycle correction. Therefore, instead of outputting the rising clock RCLK, the signal selector 340 may be configured to output the falling clock FCLK.

The selection signal generator 330 may include, for example, an exclusive NOR (XNOR) logic. Therefore, the selection signal generator 330 outputs the selection signals (Y=high level and Yb=low level) when the first and second phase detection signals RCTRL and FCTRL have the same logic level and the selection signals (Y=low level and Yb=high level) when the first and second phase detection signals RCTRL and FCTRL have different logic levels from each other. The exclusive NOR logic may include, for example, a first NOR gate NR11 that receives the first and second phase detection signals RCTRL and FCTRL, a first NAND gate ND11 that receives the first and second phase detection signals RCTRL and FCTRL, a first inverter IV11 that receives output of the first NAND gate ND11, a second NOR gate NR12 that receives output of the first NOR gate NR11 and output of the first inverter IV11 and outputs the selection signal Yb, and a second inverter IV12 that receives output of the second NOR gate NR12 and outputs the selection signal Y.

The signal selector 340 may include a first pass gate PG21 that outputs the rising clock RCLK according to the selection signals Y and Yb and a second pass gate PG22 that outputs the duty cycle corrected clock DCC_OUT according to the selection signals Y and Yb.

An example of the operation of the exemplary delay locked loop circuit with duty cycle correction according to an embodiment of the present invention that has the above-described structure will now be described.

With reference again to FIG. 3, the buffer 110 of the delay locked loop block 100 receives the external clocks CLK and CLKb, and generates and outputs the first internal clocks CLKIN1, CLKIN2, and REF_CLK.

The first internal clock CLKIN1 is delayed by the first delay line 121 and inverted, such that the falling clock FCLK is output. The first internal clock CLKIN2 is delayed by the second delay line 122 and output as the rising clock RCLK.

The reference clock REF_CLK is supplied to the phase detector 140.

The mixer controller 230 of the duty cycle correcting block 200 outputs the control signal WF that determines which one of the width of the high-level period or the low-level period of each of the falling clock FCLK and the rising clock RCLK needs to be adjusted according to a result of the comparison between the phases of the falling clock FCLK and the rising clock RCLK. For example, when a falling edge of the rising clock RCLK is earlier than a falling edge of the falling clock FCLK, the high-level period of the rising clock RCLK is narrower than the low-level period thereof, while the high-level period of the falling clock FCLK is wider than the low-level period thereof. In order that the duty correction is normally performed, the duty ratio of each of the clocks should be, for example, 50:50. Therefore, the high-level period of the rising clock RCLK needs to be widened, and the high-level period of the falling clock FCLK needs to be narrowed. As a result, the mixer controller 230 compares the phases of the falling clock FCLK and the rising clock RCLK, and outputs the control signal WF at a predetermined level. For example, the mixer controller 230 outputs the control signal WF at a high level when the falling edge of the rising clock RCLK is earlier than that of the falling clock FCLK. The mixer controller 230 outputs the control signal WF at a low level when the falling edge of the falling clock FCLK is earlier than that of the rising clock RCLK.

The mixer 210 performs the duty cycle correction so that the width of the high-level period of each of the falling clock FCLK and the rising clock RCLK is adjusted according to the level of the control signal WF and outputs the duty cycle corrected clock DCC_OUT.

The error determining unit 300 compares the phases between the falling clock FCLK and the rising clock RCLK and determines whether the duty correction error has occurred. When the duty correction error has occurred, the error determining unit 300 selects the rising clock RCLK instead of the duty cycle corrected clock DCC_OUT and feeds back the rising clock RCLK to the delay locked loop block 100. Meanwhile, when the duty correction error has not occurred, the error determining unit 300 selects the duty cycle corrected clock DCC_OUT that is normally subjected to the duty cycle correction and feeds back the duty cycle corrected clock DCC_OUT to the delay locked loop block 100. The first phase detector 310 of the error determining unit 300 outputs the first phase detection signal RCTRL at a low level when the high-level period of the rising clock RCLK is earlier than that of the reference clock REF_CLK. The first phase detector 310 outputs the first phase detection signal RCTRL at a high level when the high-level period of the rising clock RCLK is later than that of the reference clock REF_CLK. The second phase detector 320 outputs the second phase detection signal FCTRL at a low level when the high-level period of the falling clock FCLK is earlier than the that of the reference clock REF_CLK and the second phase detection signal FCTRL at a high level when the high-level period of the falling clock FCLK is later than that of the reference clock REF_CLK.

The selection signal generator 330, which may be composed of the exclusive NOR logic, outputs the selection signal Y at a high level and the selection signal Yb at a low level when the first and second phase detection signals RCTRL and FCTRL have the same logic level. Otherwise, the selection signal generator 330 outputs the selection signal Y at a low level and the selection signal Yb at a high level. The signal selector 340 selects and outputs the duty cycle corrected clock DCC_OUT when the selection signal Y is at the high level and the selection signal Yb is at the low level. The signal selector 340 selects and outputs the rising clock RCLK when the selection signal Y is at the low level and the selection signal Yb is at the high level.

When the first and second phase detection signals RCTRL and FCTRL have the same logic level, the rising clock RCLK and the falling clock FCLK are delay locked. Therefore, the phases of the rising clock RCLK and the falling clock FCLK are the same within an error range. As such, when the phases of the rising clock RCLK and the falling clock FCLK are the same, the duty cycle corrected clock DCC_OUT may have a waveform showing that the duty cycle correction is performed. When the first and second phase detection signals RCTRL and FCTRL have different logic levels, the rising clock RCLK and the falling clock FCLK are not delay locked. In one embodiment, where the delay locking operation is performed, a difference occurs between the phases of the rising clock RCLK and the falling clock FCLK due to the change in PVT. The duty cycle corrected clock DCC_OUT that is generated by using the rising clock RCLK and the falling clock FCLK having different phases from each other is output to have an abnormal waveform. When the duty cycle corrected clock DCC_OUT having the abnormal waveform is fed back to the delay locked loop block 100, this will worsen the failure in the delay locking operation. Therefore, as described above in the related art, the failure will occur due to the skew accumulation. For example, the rising clock RCLK is output instead of the duty cycle corrected clock DCC_OUT in an abnormal state. Even though the rising clock RCLK and the falling clock FCLK fed back to the delay locked loop block 100 have the different phases from each other, the normal waveforms are maintained unlike the abnormal duty cycle corrected clock DCC_OUT. Therefore, the phase difference between the rising clock RCLK and the falling clock FCLK are corrected by the operation of the delay locked loop block 100, and then input to the duty cycle correcting block 200.

Figure 5A:
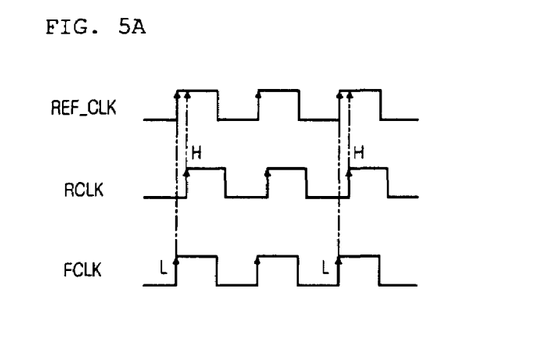
FIGS. 5A, 5B and 5C show waveform diagrams illustrating a method of correcting a duty cycle according to an exemplary embodiment of the present invention.

As shown in FIG. 5A, the phase of the rising clock RCLK is later than the phase of the falling clock FCLK The mixer controller 230 of FIG. 3 outputs the control signal WF at a low level. For example, the phase of the rising clock RCLK needs to be shifted to the left based on the phase of the reference clock REF_CLK. However, since the control signal WF is at the low level, the duty cycle correction is performed to shift the rising clock RCLK to the right. The duty cycle corrected clock DCC_OUT is fed back to the delay locked loop block 100. This causes a problem as described in the related art. However, according to the embodiment of the present invention, instead of the duty cycle corrected clock DCC_OUT, the rising clock RCLK is fed back to the delay locked loop block 100. Therefore, the above-described problem is solved, and thus, the duty correction is accurately performed.

Figure 5B:
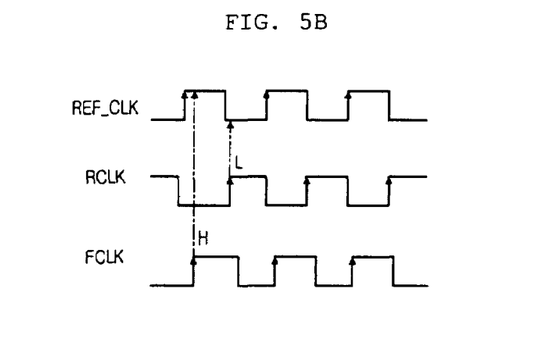

As shown in FIG. 5B, when the rising clock RCLK and the falling clock FCLK are earlier than the reference clock REF_CLK, the phase of the rising clock RCLK may be shifted to the right based on the phase of the reference clock REF_CLK. In this case, an error might occur in that a point at which the rising clock RCLK is delay locked corresponds to the N+1-th clock, not the N-th clock of the reference clock REF_CLK. However, according to the exemplary embodiment, the rising clock RCLK instead of the duty cycle corrected clock DCC_OUT is fed back to the delay locked loop block 100 at the timing when output levels of the first and second phase detection signals RCTRL and FCTRL of the first and second phase detectors 310 and 320 of the error determining unit 300 are changed. Therefore, the above-described problem is solved, and the duty correction can be accurately performed.

Figure 5C:
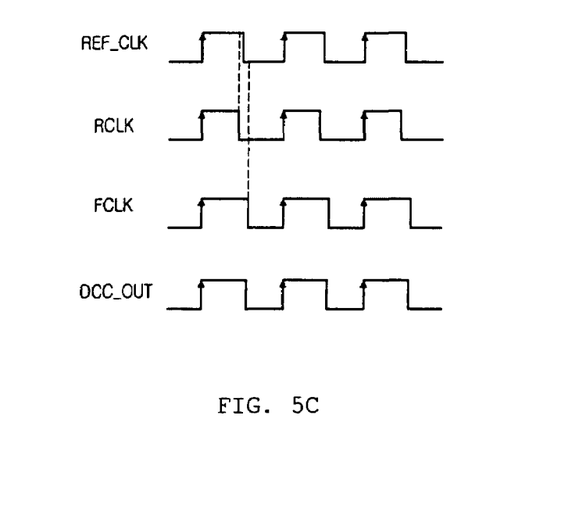

FIG. 5C shows an example of 50:50 duty cycle correction.

The delay model 130 of the delay locked loop block 100 delays the clock FB_DCC that is the output of the error determining unit 300 by a predetermined amount of time and outputs the delayed output FB_DCC to the phase detector 140.

The phase detector 140 compares the phase of the clock FB_CLK, which is the output of the delay model 130, with the phase of the reference clock REF_CLK and outputs the phase detection signal CTRL.

The shift controller 124 outputs the shift control signals SR and SL according to the phase detection signal CTRL. The shift register 123 shifts the register value to the left or right according to the shift control signals SR and SL, such that the delay amount by each of the first delay line 121 and the second delay line 122 is adjusted.

The shift controller 124 determines the result of the comparison between the phases of the reference clock REF_CLK and the output FB_CLK, which is delayed by the adjusted delay amount and subjected to the duty cycle correction, of the delay model 130 according to the phase detection signal CTRL. The shift controller 124 determines that the clock FB_CLK and the reference clock REF_CLK are delay locked at the timing with the least amount of jitter according to the comparison result, and activates a phase locked signal.

In response to the activated phase locked signal, a driver of the phase splitter 220 operates, and finally, delay locked loop clocks FCLK_DLL and RCLK_DLL that are delay locked and subjected to the duty cycle correction are output.

Figure 6A:
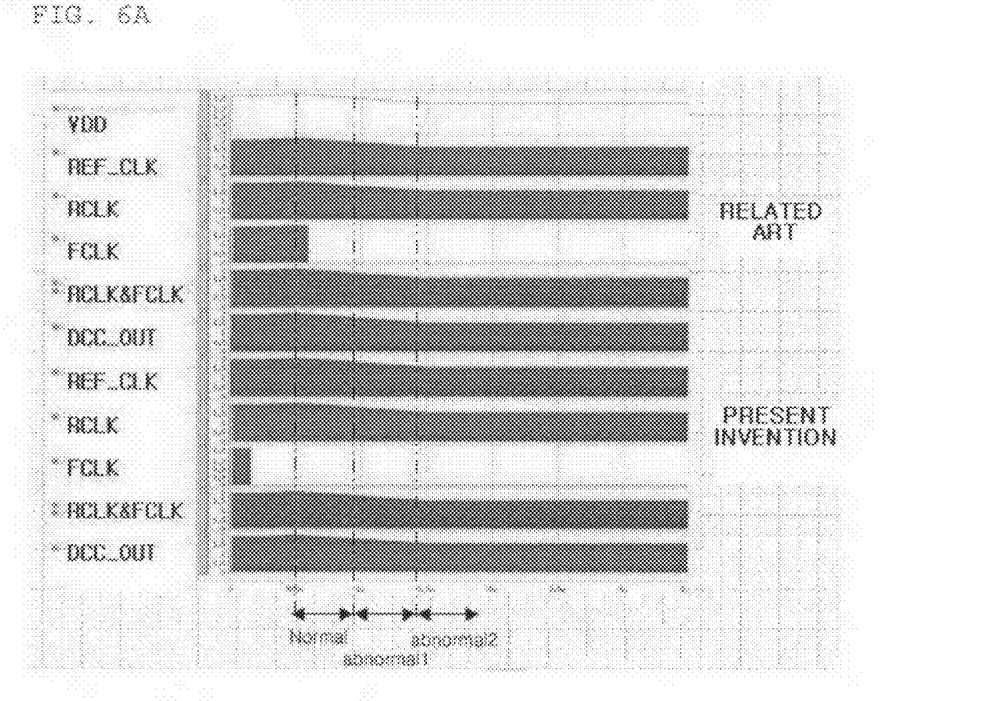
FIGS. 6A to 6D are waveform diagrams illustrating simulation of the operation of the delay locked loop circuit with duty cycle correction according to the exemplary embodiment of the present invention.

FIGS. 6A to 6D are waveform diagrams illustrating simulation of the operation of the delay locked circuit with the duty cycle correction according to the exemplary embodiment. As shown in FIG. 6A, in order to represent a change in PVT, a voltage continuously drops from, for example, 1.8 to 1.4 V. It can be seen that the swing width of each of the clocks changes according to the voltage drop.

Figure 6B:
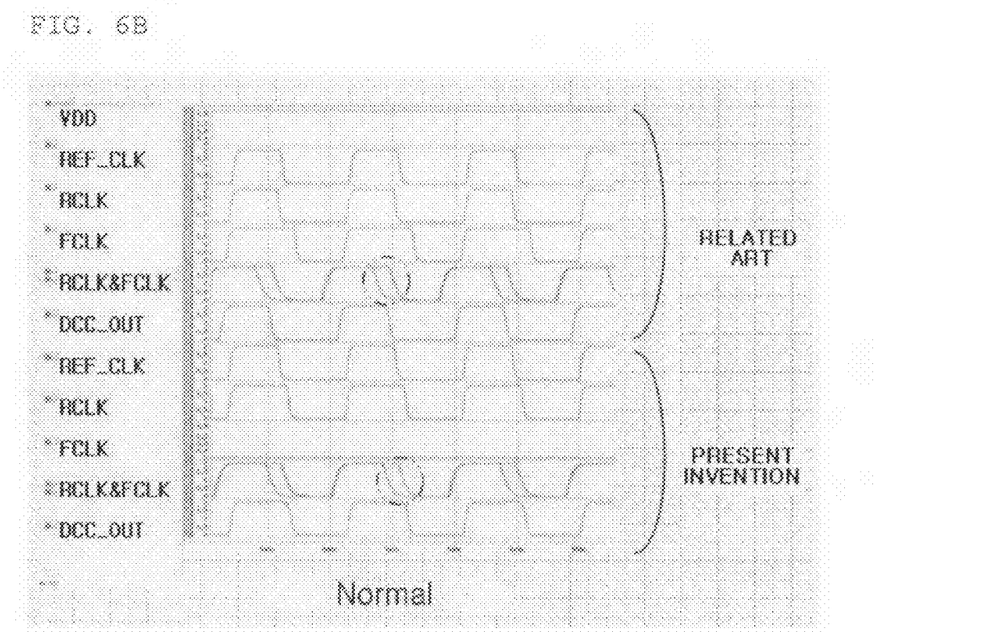

In a case of a normal state, that is, under the condition of a normal voltage, as shown in FIG. 6B, it can be seen that the duty cycle correction is normally performed in both the related art and the present invention.

Figure 6C:
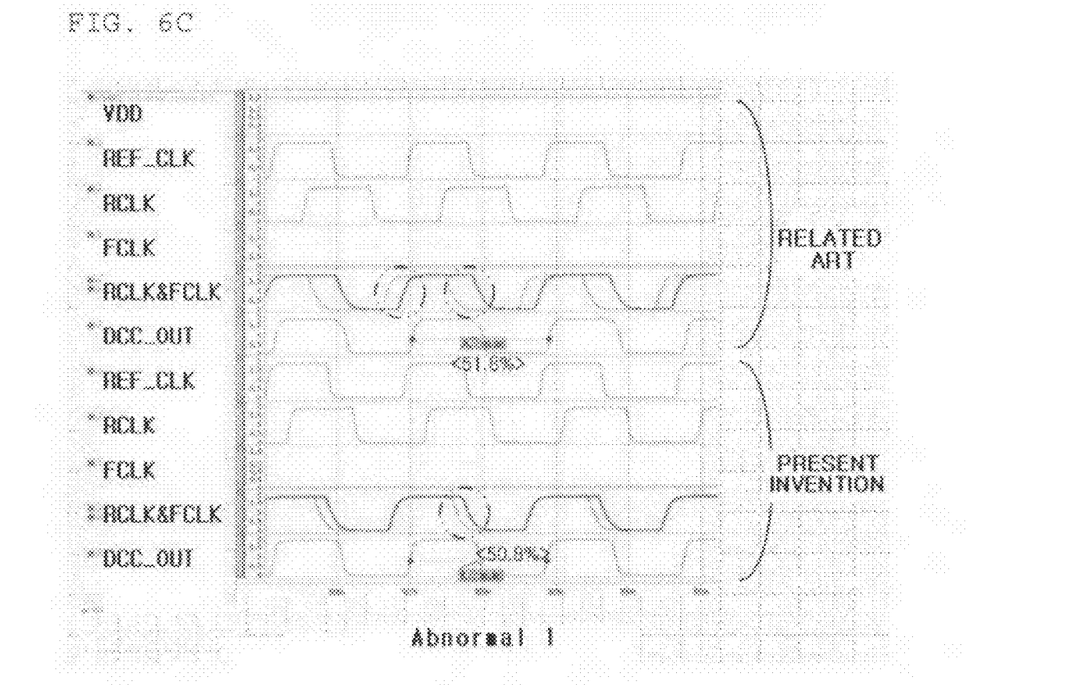

When it is in a state abnormal 1 of initial voltage drop, as shown in FIG. 6C, in the related art, since the rising clock RCLK is not normally delay locked based on the reference clock REF_CLK, a duty ratio of the duty cycle corrected clock DCC_OUT is 51.8%, that is, the duty ratio does not fall within a normal value. Therefore, the operation of the duty correction deteriorates over time. On the other hand, according to the exemplary embodiment of the present invention, the duty ratio of the duty cycle corrected clock DCC_OUT is 50.8%. That is, the duty ratio approximates to the normal value.

Figure 6D:
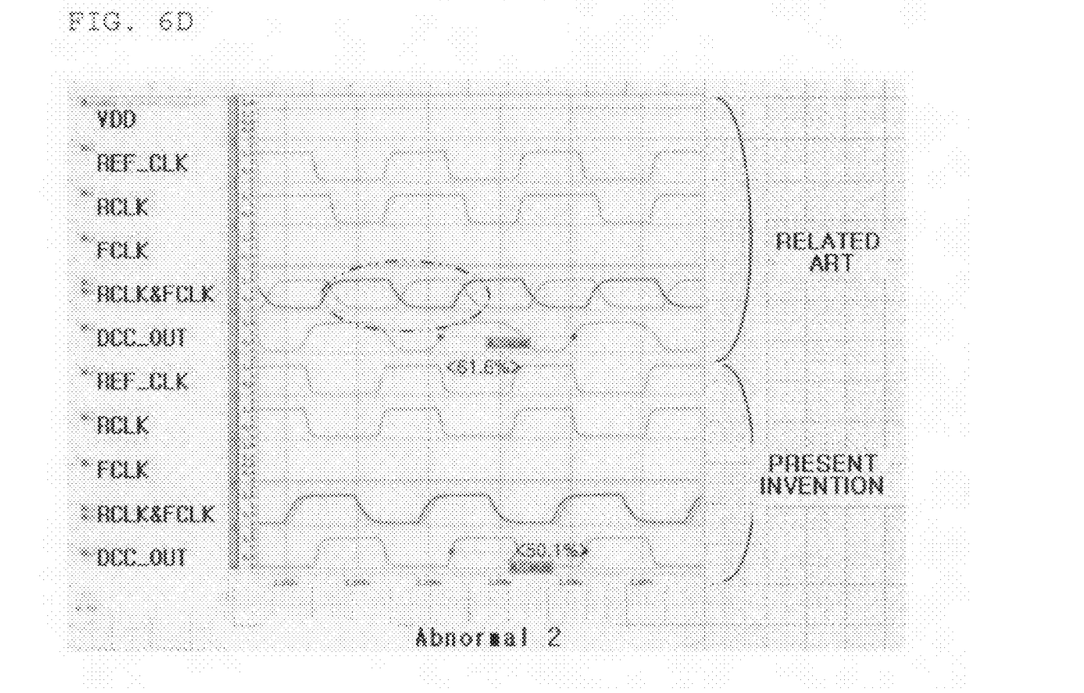

In FIG. 6D, a state abnormal 2 in which the voltage further drops as compared with the state abnormal 1 of initial voltage drop is illustrated. In the related art, it seems that on the basis of the reference clock REF_CLK, the rising clock RCLK is normally delay locked. However, in FIG. 6D, since the point at which the rising clock RCLK is delay locked corresponds to the N+1-th clock of the reference clock REF_CLK, not the N-th clock, the skew between the rising clock RCLK and the falling clock FCLK increases, and the duty ratio of the duty cycle corrected clock DCC_OUT is 61.6%. That is, it may be impossible to normally perform the operation. On the other hand, according to the embodiment of the present invention, the point at which the rising clock RCLK is delay locked corresponds to the N-th clock of the reference clock REF_CLK, and there is little skew between the rising clock RCLK and the falling clock FCLK. Further, in the exemplary embodiment of the present invention, the duty ratio of the duty cycle corrected clock DCC_OUT is 50.1%. Therefore, the duty correction is accurately performed despite a drastic change in external environment.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The delay locked loop circuit with duty cycle correction and the method of controlling the same according to the exemplary embodiment of the present invention determine whether a duty correction error occurs or not and prevents a failure that occurs in the operation of the delay locked loop due to abnormal feedback. Therefore, even when the change in PVT occurs, the duty cycle correction and the delay locking operation can be stably and accurately performed to thereby increase the performance and reliability of the products.

What is claimed is:

1. A delay locked loop circuit, comprising:
   a delay locked loop block that receives external clocks to generate first internal clocks including a reference clock, including:
   an internal delay unit that delays the first internal clocks to output second internal clocks,
   which are fed back to the delay locked loop block, which adjusts delay time of the delay unit according to a phase difference between each second internal clock and the reference clock so that the second internal clocks are delay locked;
   a duty cycle correcting block that corrects a duty cycle of each second internal clock and outputs a duty cycle corrected clock; and
   an error determining unit that compares each phase of the second internal clocks with the reference clock and, based on the comparison, feeds back the duty cycle corrected clock or one of the second internal clocks as a feedback clock to the delay locked loop block, wherein the delay locked loop block includes:
   a buffer that receives the external clocks and generates the first internal clocks; and
   a phase detector that compares a phase of the reference clock and a phase of the feedback clock and outputs a phase detection signal, wherein the delay unit adjusts the delay time of each first internal clock based on the phase detection signal.

2. The delay locked loop circuit of claim 1, wherein the delay unit includes:
   a shift controller that outputs shift control signals based on the phase detection signal;
   a shift register that receives the shift control signals and outputs register values based on the shift control signals; and
   a plurality of delay lines that each delays each first internal clock by a delay time corresponding to the register value and outputs a corresponding second internal clock.

3. The delay locked loop circuit of claim 1, wherein the duty cycle correcting block includes:

a mixer controller that compares a phase of each second internal clock to one another and generates a control signal based on the comparison; and a mixer that corrects a duty cycle of each second internal clock based on the control signal and outputs the duty cycle corrected clock.

4. The delay locked loop circuit of claim 3, wherein the duty cycle correcting block further includes:

a phase splitter that splits a phase of the duty cycle corrected clock and outputs delay locked loop clocks.

5. The delay locked loop circuit of claim 1, wherein the error determining unit:

is configured to feed back the duty cycle corrected clock when conditions are satisfied, and feed back one of the second internal clocks when the conditions are not satisfied;

wherein, the conditions include that all phases of the second internal clocks are earlier than a phase of the reference clock or later than the phase of the reference clock.

6. The delay locked loop circuit of claim 1, wherein the error determining unit includes:

phase detectors that compare each phase of the second internal clocks with the reference clock and outputs a phase detection signal;

a selection signal generator that combines the phase detection signals and generates selection signals; and a signal selector that feed backs one of the second internal clocks or the duty cycle corrected clock to the delay locked loop block based on the generated selection signals.

7. The delay locked loop circuit of claim 6, wherein the selection signal generator compares the detection signals to one another and outputs the selection signal for selecting the duty cycle corrected clock when the detection signals have a same level, and outputs the selection signal for selecting the one of the second internal clocks when the detection signals have different level from each other.

8. The delay locked loop circuit of claim 6, wherein the selection signal generator includes:

a first logic element and a second logic element that receive the detection signals;

a first inverting element that receives output of the second logic element;

a third logic element that receives output of the first logic element and output of the first inverting element; and a second inverting element that receives output of the third logic element and outputs the selection signal.

9. The delay locked loop circuit of claim 6, wherein the signal selector includes:

a first switching element that outputs one of the second internal clocks based on the selection signals; and a second switching element that outputs the duty cycle corrected clock based on the selection signals.

10. The delay locked loop circuit of claim 1, wherein one of the second internal clocks is a clock in synchronization with a rising edge of the external clock.

11. A method of controlling a delay locked loop circuit that includes a delay locked loop block and a duty cycle correcting block that corrects duty cycles of a plurality of clocks output from the delay locked loop block and outputs a duty cycle corrected clock, the method comprising:

determining whether or not an error occurs in the duty cycle corrected clock by using a comparison result of comparing each phase of the plurality of clocks output from the delay locked loop block with a reference clock; and feeding back to the delay locked loop block one of the duty cycle corrected clock or one of the plurality of clocks that are output by the delay locked loop block according to a result of determining whether or not the error occurs in the duty cycle corrected clock, wherein one of the plurality of clocks is a clock in synchronization with a rising edge of the external clock.

12. The method of claim 11, wherein the determining of whether or not the error occurs in the duty cycle corrected clock includes:

determining that the duty cycle corrected clock is in a normal state when conditions are satisfied; and determining that the error occurs in the duty cycle corrected clock when the conditions are not satisfied, wherein, the conditions include that all phases of the plurality of clocks are earlier than a phase of the reference clock or later than the phase of the reference clock.

13. The method of claim 11, wherein the feeding back includes:

feeding back the duty cycle corrected clock to the delay locked loop block when it is determined that the duty cycle corrected clock is in a normal state; and feeding back one of the plurality of clocks, which are output from the delay locked loop block, to the delay locked loop block when the error occurs in the duty cycle corrected clock.

* * * * *